(12) United States Patent
Ha

(10) Patent No.: US 7,453,737 B2
(45) Date of Patent: *Nov. 18, 2008

(54) PROGRAM METHOD WITH OPTIMIZED VOLTAGE LEVEL FOR FLASH MEMORY

(75) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/810,725

(22) Filed: Jun. 7, 2007

(65) Prior Publication Data

US 2008/0031047 A1 Feb. 7, 2008

Related U.S. Application Data

(63) Continuation of application No. 11/156,223, filed on Jun. 17, 2005, now Pat. No. 7,239,557.

(51) Int. Cl.
*G11C 11/34* (2006.01)
(52) U.S. Cl. .............................. 365/185.33; 365/185.17; 365/185.19; 365/185.22
(58) Field of Classification Search ............ 365/185.33, 365/185.17, 185.19, 185.22
See application file for complete search history.

(56) References Cited

U.S. PATENT DOCUMENTS

| | | | |
|---|---|---|---|
| 5,257,225 A | 10/1993 | Lee | |
| 5,357,463 A | 10/1994 | Kinney | |
| 5,768,287 A | 6/1998 | Norman et al. | |
| 6,188,613 B1 | 2/2001 | Manning | |
| 6,466,480 B2 | 10/2002 | Pekny | |
| 6,493,270 B2 | 12/2002 | Chevallier | |

(Continued)

FOREIGN PATENT DOCUMENTS

GB  2 308 701 A  7/1997

OTHER PUBLICATIONS

H. Shiga et al., A Sampling Weak-Program Method to Tighten Vth-distribution of 0.5V for Low-Voltage Flash Memories, Symposium on VLSI Circuits Digest of Technical Papers, 1999, pp. 33-36.

*Primary Examiner*—Richard Elms
*Assistant Examiner*—Nam Nguyen
(74) *Attorney, Agent, or Firm*—Leffert Jay & Polglaze, P.A.

(57) ABSTRACT

A non-volatile memory device and programming process is described that increases the programming voltage of successive programming cycles in relation to the percentage of the data bits that failed programming verification during the previous programming cycle and were not correctly programmed into the memory array. This allows for a faster on average program operation and a more accurate match of the subsequent increase in the programming voltage to the non-volatile memory device, the specific region or row being programmed and any changes due to device wear. In one embodiment of the present invention the manufacturing process/design and/or specific memory device is characterized by generating a failed bit percentage to programming voltage increase profile to set the desired programming voltage delta/increase. In another embodiment of the present invention, methods and apparatus are related for the programming of data into non-volatile memory devices and, in particular, NAND and NOR architecture Flash memory.

26 Claims, 8 Drawing Sheets

U.S. PATENT DOCUMENTS

| | | |
|---|---|---|
| 6,657,896 B2 | 12/2003 | Hosono et al. |
| 6,882,567 B1 | 4/2005 | Wong |
| 6,898,126 B1 | 5/2005 | Yang et al. |
| 7,050,334 B2 * | 5/2006 | Kim et al. .............. 365/185.28 |
| 2004/0109352 A1 | 6/2004 | Lee et al. |
| 2004/0237000 A1 | 11/2004 | Keays |
| 2005/0057966 A1 | 3/2005 | Nazarian |

* cited by examiner

V1, V2, ..., VN can be different or can be the same.

PROGRAM METHOD WITH OPTIMIZED VOLTAGE LEVEL FOR FLASH MEMORY

RELATED APPLICATIONS

This application is a continuation of U.S. patent application Ser. No. 11/156,223 filed Jun. 17, 2005 now U.S. Pat. No. 7,239,557 and titled "PROGRAM METHOD WITH OPTIMIZED VOLTAGE LEVEL FOR FLASH MEMORY," which is commonly assigned and incorporated by reference in its entirety herein.

TECHNICAL FIELD OF THE INVENTION

The present invention relates generally to memory devices and in particular the present invention relates to Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. A typical floating gate memory cell is fabricated in an integrated circuit substrate and includes a source region and a drain region that is spaced apart from the source region to form an intermediate channel region. A floating gate, typically made of doped polysilicon, is disposed over the channel region and is electrically isolated from the other cell elements by a dielectric material, typically an oxide. For example, gate oxide can be formed between the floating gate and the channel region. A control gate is located over the floating gate and is also typically made of doped polysilicon. The control gate is electrically separated from the floating gate by another dielectric layer. Thus, the floating gate is "floating" in dielectric so that it is insulated from both the channel and the control gate. Charge is transported to or removed from the floating gates by specialized programming and erase operations, respectively. Other types of non-volatile memory include, but are not limited to, Polymer Memory, Ferroelectric Random Access Memory (FeRAM), Ovionics Unified Memory (OUM), and Magnetoresistive Random Access Memory (MRAM).

Yet another type of non-volatile memory is a Flash memory. A typical Flash memory comprises a memory array, which includes a large number of memory cells. Each of the memory cells includes a floating gate or charge trapping layer embedded in a field effect transistor (FET) transistor. The cells are usually grouped into sections called "erase blocks." Each of the cells within an erase block can be electrically programmed selectively by tunneling charges to the floating gate. The negative charge is typically removed from the floating gate by a block erase operation, wherein all floating gate memory cells in the erase block are erased in a single operation. It is noted that in recent Flash memory devices multiple bits have been stored in a single cell by utilizing multiple threshold levels or a non-conductive charge trapping layer and storing data trapped in a charge near each of the sources/drains of the memory cell FET.

Two common types of Flash memory array architectures are the "NAND" and "NOR" architectures, so called for the resemblance which the basic memory cell configuration of each architecture has to a basic NAND or NOR gate circuit, respectively. In the NOR array architecture, the floating gate memory cells of the memory array are arranged in a matrix. The gates of each floating gate memory cell of the array matrix are connected by rows to word select lines (word lines) and their source/drains are connected to column bit lines and/or source lines. A NAND array architecture also arranges its array of floating gate memory cells in a matrix such that the gates of each floating gate memory cell of the array are connected by rows to word lines. However each memory cell is not directly connected to a source line and a column bit line. Instead, the memory cells of the array are arranged together in strings, typically of 8, 16, 32, or more each, where the memory cells in the string are connected together in series, source to drain, between a common source line and a column bit line. A memory cell of the NAND architecture floating gate memory array is then accessed by activating a row of floating gate memory cells coupled to the selected memory cell by selecting the word select line connected to their gates. In addition, the word lines connected to the gates of the unselected memory cells of the string are also driven (at a higher voltage) to place them in a pass through mode to allow access to the selected memory cell.

Common programming technique for Flash memories programs a row (a page) of the memory by applying a programming voltage or series of programming voltage pulses to the control gates and programming or inhibiting the selected memory cells to either program (set at logical "0") or inhibit (not program, usually intended to leave cell erased and set at logical "1"). These programming voltages and/or pulses are typically set by the design and, in certain cases, are trimmed or selected during the manufacturing process, further increasing manufacture costs. However, due to manufacturing process variations from chip to chip, or even from region to region or row to row of a memory array, not every Flash memory or Flash memory cell will program the same for a given applied programming voltage. In addition, even where the programming voltages are selected during manufacturing for the individual memory device the programming characteristics of the memory device can change after multiple program/erase cycles, or changes in supply voltage or temperature.

For the reasons stated above, and for other reasons stated below which will become apparent to those skilled in the art upon reading and understanding the present specification, there is a need in the art for alternative methods of programming Flash memory arrays.

DETAILED DESCRIPTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Embodiments of the present invention include non-volatile memory devices that program data into the non-volatile array in a parallel operation, such as the programming of a row of the memory array, and where the programming cycle repeats with increasing programming voltage levels to program any bits of the data that failed to program correctly in the previous cycles. In embodiments of the present invention, the programming voltage of successive programming cycles is increased in relation to the percentage of the data bits that failed programming verification during the previous programming cycle and were not correctly programmed into the memory array. This allows for a faster on average program operation and a more accurate match of the subsequent increase in the programming voltage to the specific non-volatile memory device, the specific region or row being programmed, and any changes in programming characteristics due to device use and wear. In one embodiment of the present invention the manufacturing process/design and/or specific memory device is characterized by generating a failed bit percentage to programming voltage increase profile to set the desired programming voltage delta/increase for a given failing percentage of data bits. In one embodiment of the present invention, methods and apparatus are related for the programming of data into non-volatile memory devices and, in particular, NAND and NOR architecture Flash memory arrays and devices.

Figure 1:
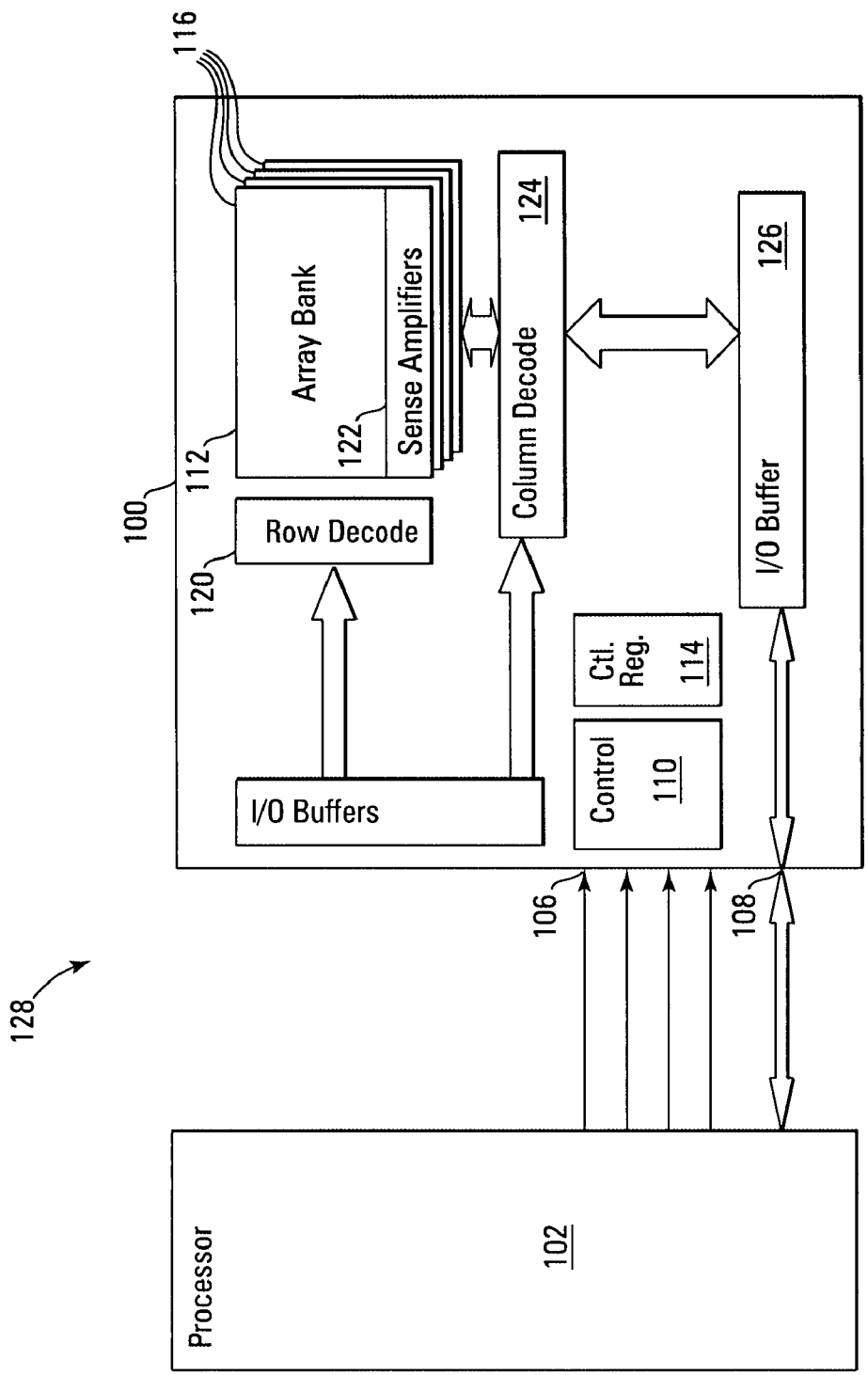
FIG. 1 is a simplified block diagram of a system containing a non-volatile memory device in accordance with an embodiment of the present invention.

FIG. 1 details a simplified diagram of a system 128 incorporating a non-volatile memory device 100 of an embodiment of the present invention connected to a host 102, which is typically a processing device or memory controller. The non-volatile memory 100, such as a Flash memory device, has a control interface 106 and an address/data interface 108 that are each connected to the processing device 102 to allow memory read and write accesses. It is noted that in alternative embodiments, the address/data interface 108 can be divided into separate interfaces. Internal to the non-volatile memory device a control state machine/control circuit 110 directs the internal operation; managing the non-volatile memory array 112 and updating RAM control registers and erase block management registers 114. The RAM control registers and tables 114 are utilized by the control state machine 110 during operation of the non-volatile memory 100. The non-volatile memory array 112 contains a sequence of memory banks or segments 116, each bank 116 is organized logically into a series of erase blocks (not shown). Memory access addresses are received on the address/data interface 108 of the non-volatile memory 100 and divided into a row and column address portions. On a read access the row address is latched and decoded by row decode circuit 120, which selects and activates a row page (not shown) of memory cells and the other memory cells in their associated strings across a selected memory bank. The bit values encoded in the output of the selected row of memory cells are connected from a local bitline/string (not shown) to a global bitline (not shown) and detected by sense amplifiers 122 associated with the memory bank. The sense amplifiers 122 also typically include a data cache and write data latch circuits (not shown). The column address of the access is latched and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells. It is noted that in one embodiment of the present invention, the column decode 124 may be optionally placed between the memory array 112 and the sense amplifiers 122.

As previously stated, the two common types of non-volatile memory EEPROM and Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

A NAND memory array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture floating gate memory array is accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Figure 2:
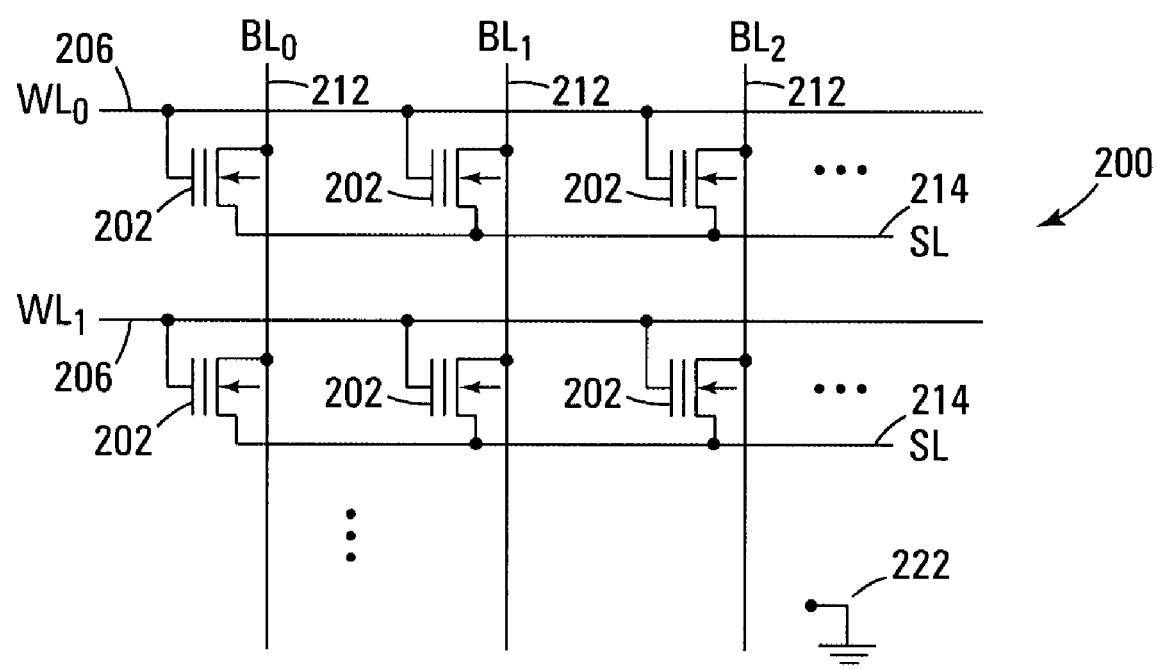
FIG. 2 is a simplified block diagram of a NOR architecture Flash memory array in accordance with an embodiment of the present invention.

FIG. 2 details a simplified NOR floating gate memory array 200 of a EEPROM or Flash memory device of an embodiment of the present invention. In FIG. 2, floating gate memory cells 202 are coupled together in a NOR architecture memory array having bit lines 212, source lines 214, word lines 206, and substrate connection 222. Each floating gate memory cell 202 has a floating gate field effect transistor (FET) comprising a gate-insulator stack formed between drain and source regions that are coupled to a bit line 212 and a source line 214, respectively.

Figure 3:
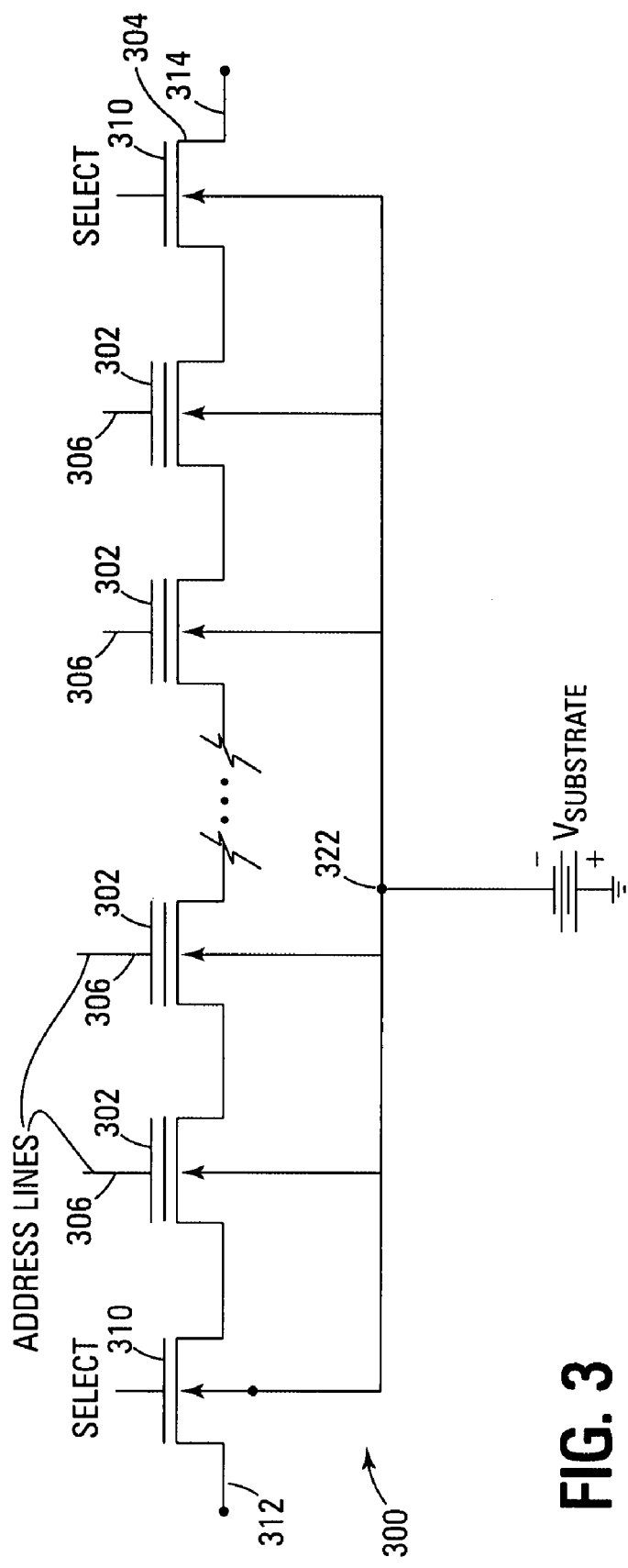
FIG. 3 is simplified block diagram of a series string of floating gate memory cells of a NAND architecture Flash memory array in accordance with an embodiment of the present invention.

FIG. 3 details a simplified NAND floating gate memory array string 304 of a EEPROM or Flash memory device of an embodiment of the present invention. In FIG. 3, a series of floating gate memory cells 302 are coupled together source to drain in a series NAND string 304 (typically of 8, 16, 32, or more cells). Each floating gate memory cell 302 has a gate-insulator stack that is made of a tunnel insulator on top of a substrate, a floating gate formed on the tunnel insulator, an intergate/interpoly insulator formed over the floating gate, and a control gate 306 (typically formed as part of the word line) formed over the intergate/interpoly insulator of each floating gate memory cell 302. Impurity doped regions (typically N+ for N-FET memory cells) are formed between each gate insulator stack to form the source and drain regions of the adjacent floating gate memory cells, which additionally operate as connectors to couple the cells of the NAND string 304 together. A substrate connection 322 is also shown. Select gates 310, are formed at either end of the NAND floating gate string 304 and selectively couple opposite ends of the NAND floating gate string 304 to a bit line contact 312 and a source line contact 314.

Figure 4:
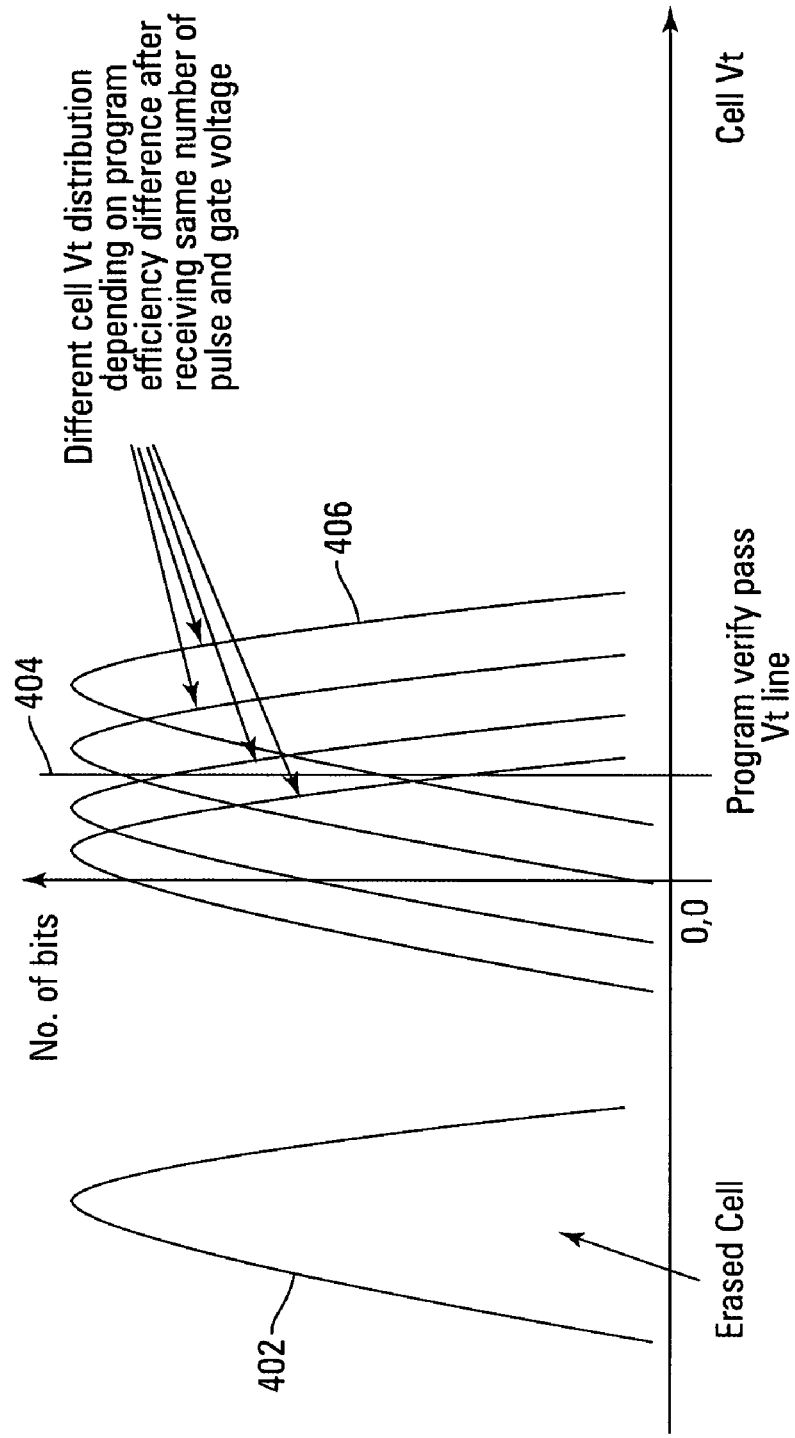
FIG. 4 is a diagram detailing erased and programmed Vt distribution of floating gate memory cells.

Common programming technique for Flash memories programs a row (commonly referred to as a page) of the memory by applying a programming voltage or series of programming voltage pulses to the control gates of the memory cells and programming or inhibiting the selected memory cells to either program (set at logical "0") or inhibit (not program, usually intended to leave the cell erased and set at logical "1") by coupling their channels to either a program or inhibit voltage. Unfortunately, this programming of the memory cells is generally not uniform across each row of the memory array. This non-uniform injection of carriers into the floating gates of the memory cells leads to a distribution of shifted threshold voltages in the programmed cells, as detailed in FIG. 4. In FIG. 4, the distribution of threshold voltages (Vt) of floating gate memory cells in the erased 402 and programmed states 406 is shown. For a memory cell to be read as programmed it must have shifted its threshold voltage above that of the programmed cell threshold voltage limit 404. However, due to device wear levels (memory cell write fatigue) and manufacturing process variations from chip to chip, and even from area to area of a memory array, not every Flash memory or Flash memory cell will program the same for a given applied programming voltage, pulses, and time periods, giving the wide variations in the programmed cell threshold voltage distributions 406 after a program cycle as shown in FIG. 4. As a result, many of the cells that had a programming voltage applied to them will not read as having been programmed when checked afterwards for verification if their individual threshold voltages have not been raised above the programmed cell threshold voltage limit 404.

Figure 5:
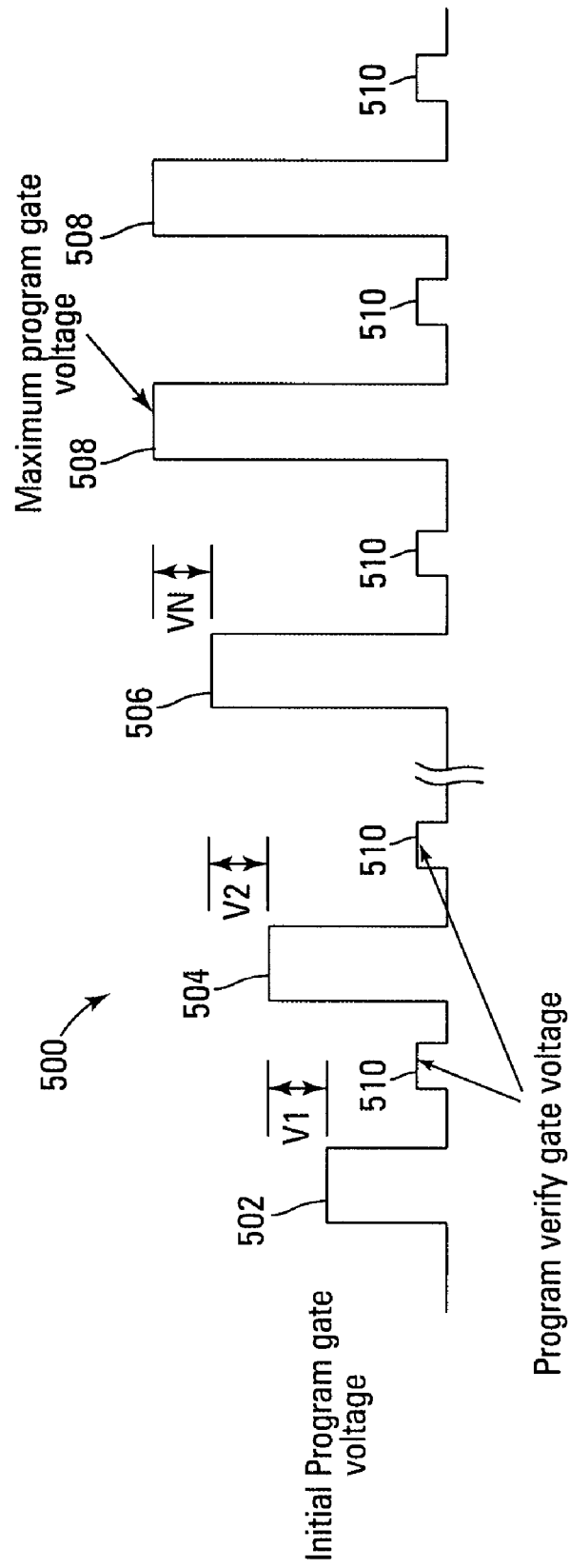
FIG. 5 is a waveform diagram detailing a programming operation of a non-volatile memory device in accordance with an embodiment of the present invention.

Because of this, after the initial programming attempt, the data stored in the row is then read back out of the row and checked against the original data to verify correct programming. An effort is then typically made to correct any cells that did not program as intended by applying additional programming pulses to the control gates of those cells for a set number of programming cycle iterations. These additional programming voltage pulses are also typically stepped up at a selected voltage rate until the maximum programming voltage for the memory device has been reached. In FIG. 5, a waveform diagram 500 is detailed showing such a programming operation of a non-volatile memory device, with increased voltage programming pulses 502, 504, 506, 508 being applied and the programming results verified 510 after each pulse, from the initial programming voltage 502 to the maximum programming voltage 508 possible in the memory device.

Figure 6:
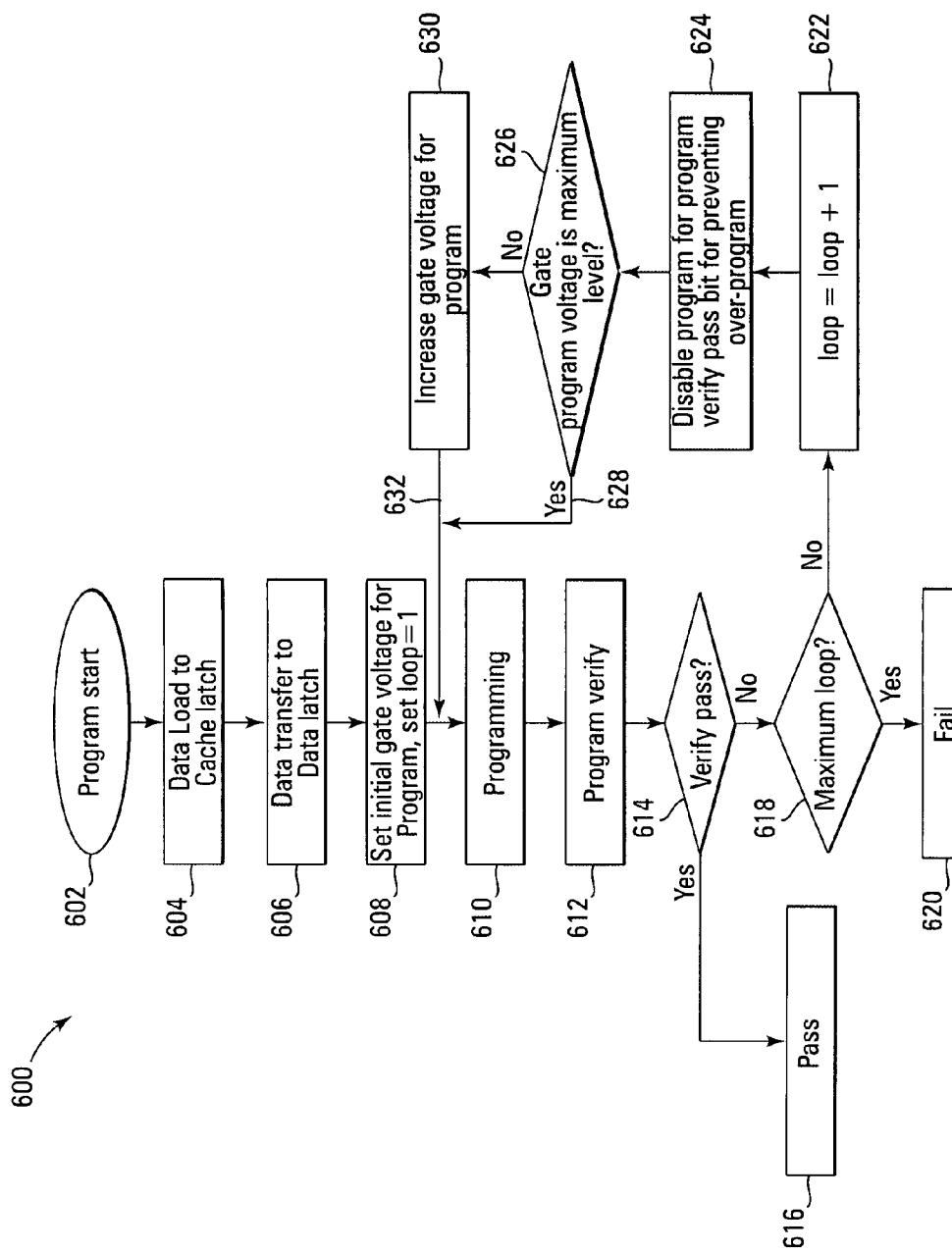
FIG. 6 is a flowchart of a programming operation of a NAND architecture Flash memory of the prior art.

FIG. 6 details a flowchart of prior art programming algorithm 600 in a NAND or parallel programming non-volatile memory device. In FIG. 6, a program operation begins 602 with the reception of a program command containing an address at the non-volatile memory device, such as a NAND architecture Flash memory device. Program data (typically 2 k bytes) is then loaded 604 into the memory device following the program command and stored in the data cache. The data is then transferred 606 to the data latch of the write sense amplifiers in preparation for programming into a row of the no-volatile memory array. The initial programming gate voltage is then set 608 (such as 15V) and a program cycle loop counter is set to 1. The row of data is then programmed 610 into the selected row of the non-volatile memory array by pulsing the control gates with the programming voltage and coupling their channels to either a program or inhibit voltage. After the programming pulse has been applied and the data programmed into the row, it is read out again and compared against the original data held in the data cache to verify its correct programming 612. If the program data passes 614 verification, we complete the programming operation and finish 616. If the program data fails verification, and the maximum number of programming cycles has not been reached (the loop counter has not reached its maximum value 618) the program operation continues and attempts to program the data again. If the maximum number of programming cycles has been reached (the loop counter has reached its maximum value), the programming operation has failed 620.

In looping to attempt to re-program the data bits that failed verification, the algorithm increments the loop counter 622 and disables or inhibits 624 programming of the bits of the row of data that have passed program verification to prevent over-programming of these cells and unnecessary write fatigue of the non-volatile memory device. If the gate programming voltage is not at its maximum level 626, it is incrementally increased 630 (unprogrammed cells are rarely failing cells and are typically only happen to be slow programming cells at the lower voltage, so the memory device will typically increase the voltage on these cells and try again). If the gate programming voltage is already at the maximum level, it is not increased and is left at maximum 628. The algorithm is then looped 632 to program the data row again 610. This looping of the algorithm continues, incrementally increasing the programming voltage on each loop, until the programmed data finally passes verification 616 or the maximum number of programming cycle loops is exceeded and the programming operation has failed 630.

As stated above, with its repeated iterations and incremental increases in gate programming voltages, the prior art programming process does not lend itself to a fast program operation. In addition, it does not provide an accurate match of the subsequent increase in the programming voltage to the specific non-volatile memory device, the specific region or row being programmed, or any changes in the memory cell programming characteristics due to device use and wear.

Embodiments of the present invention utilize an improved programming method to provide for an overall faster programming operation and provide better matching of the programming operation to the specific non-volatile memory device and any changes in the memory cell programming characteristics due to device use and wear. In embodiments of the present invention, the programming voltage of successive programming cycles is increased in relation to the percentage of the data bits that failed programming verification during the previous programming cycle and were not correctly programmed into the memory array. This allows for a faster program operation and a more accurate match of the subsequent increase in the programming voltage to the specific non-volatile memory device, the specific region or row being programmed, and any changes in programming characteristics due to device use and wear.

It is noted that the programming method of embodiments of the present invention can be utilized in NAND Flash memory devices, NOR Flash memory devices, and any non-volatile memory device that bulk programs data in parallel to improve programming speed and better adapt its programming cycle to the specific memory device.

Figure 7:
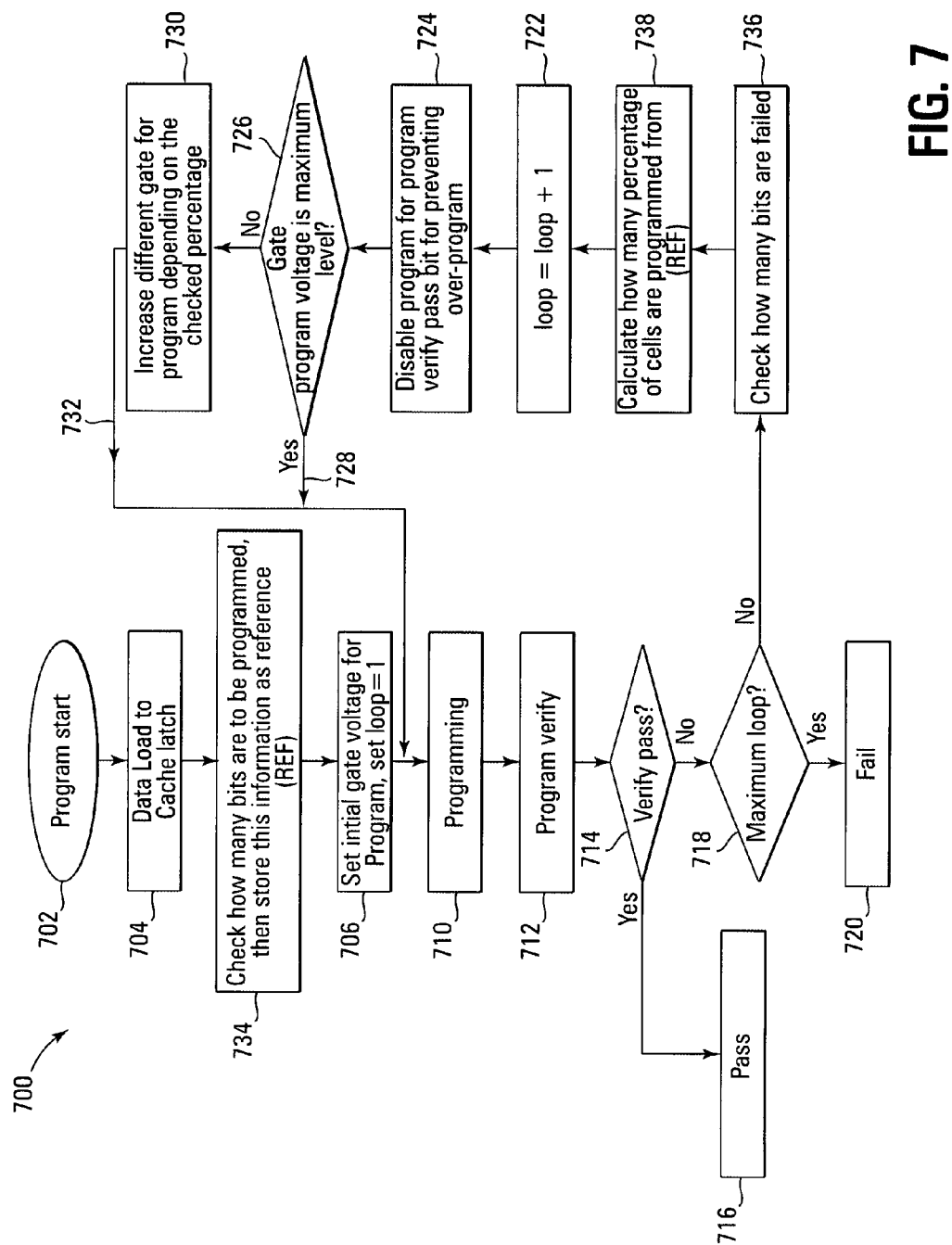
FIG. 7 is a flowchart of a programming operation of a NAND architecture Flash memory in accordance with an embodiment of the present invention.

FIG. 7 details a programming process flowchart 700 of an embodiment of the present invention. In FIG. 7, a program operation begins 702 with the reception of a program command containing an address at the non-volatile memory device, such as a NAND architecture Flash memory device. Program data (typically 2 k bytes) is then loaded 704 into the memory device following the program command and stored in the data cache. The data in the data cache is then analyzed 734 by the memory device to determine and store the total number of data bits there are to be programmed in the program data. The data is then transferred 706 to the data latch of the write sense amplifiers in preparation for programming into a row of the no-volatile memory array. The initial programming gate voltage is then set 708 (such as 15V) and a program cycle loop counter is set to 1. The row of data is then programmed 710 into the selected row of the non-volatile memory array by pulsing the control gates with the programming voltage and coupling their channels to either a program or inhibit voltage. After the programming pulse has been applied and the data programmed into the row, it is read out again and compared against the original data held in the data cache to verify if correct programming has occurred 712. If the program data passes 714 verification, we complete the programming operation and finish 716. If the program data fails verification, and the maximum number of programming cycles has not been reached (the loop counter has not reached its maximum value 718), the program operation continues and attempts to program the failed data bits again. If the maximum number of programming cycles has been reached (the loop counter has reached its maximum value), the programming operation has failed and ends 720.

In looping to attempt to re-program the data bits that failed verification, the algorithm checks the total number of program bits in the programmed data failed 736 and then calculates 738 the percentage of memory cells/program bits failed. The loop counter 722 is then incremented and the verified and passing data bits are disabled or inhibited 724 to prevent over-programming of these cells. If the gate programming voltage is not at its maximum level 726, it is increased according to the overall percentage of failing bits 730; with a high percentage of failing bits the programming voltage is increased at a higher rate and with a low percentage of failing bits the programming voltage is increased at a lower rate. If the gate programming voltage is already at the maximum level, it is not increased and is left at maximum 728. The algorithm is then looped 732 to program the data row again 710. This looping of the algorithm continues, increasing the programming voltage on each loop according to the percentage of failing bits to programmed bits, until the programmed data finally passes verification 716 or the maximum number of programming cycle loops is exceeded and the programming operation fails 720.

In one embodiment of the present invention the manufacturing process and design of the memory device is profiled in order to increase the accuracy of the match of the voltage increase change/delta that is required for a given percentage of failing bits. Such a failed bit percentage to voltage increase profile curves have been found to typically not vary or change for a given supply voltage or memory device wear usage level, thus providing an accurate voltage increase map. This profile is then incorporated/programmed into the memory device as it is manufactured. It is noted that this failed bit percentage to voltage increase profiling can be done for each individual memory device also, allowing profiling of the overall memory device and/or individual regions of the memory array, so that the voltage increase profile to be adjusted for the individual memory device. However, it is also noted that this typically requires increased manufacturing complexity and has a higher resulting memory device unit cost. In addition, in one embodiment of the present invention, the memory device keeps internal programming statistics on memory cell fatigue and wear in the overall memory device and/or individual regions of the memory array, allowing the voltage increase profile to be adjusted for the individual memory device's wear level.

Because of the faster and more accurate increase in programming voltage, programming operations of non-volatile memory devices of the present invention typically program a given row of data in fewer programming cycles than that of a prior art memory device. This allows for faster writes, less power consumption due to fewer programming cycles and results in faster overall operation of the non-volatile memory device.

Figure 8:
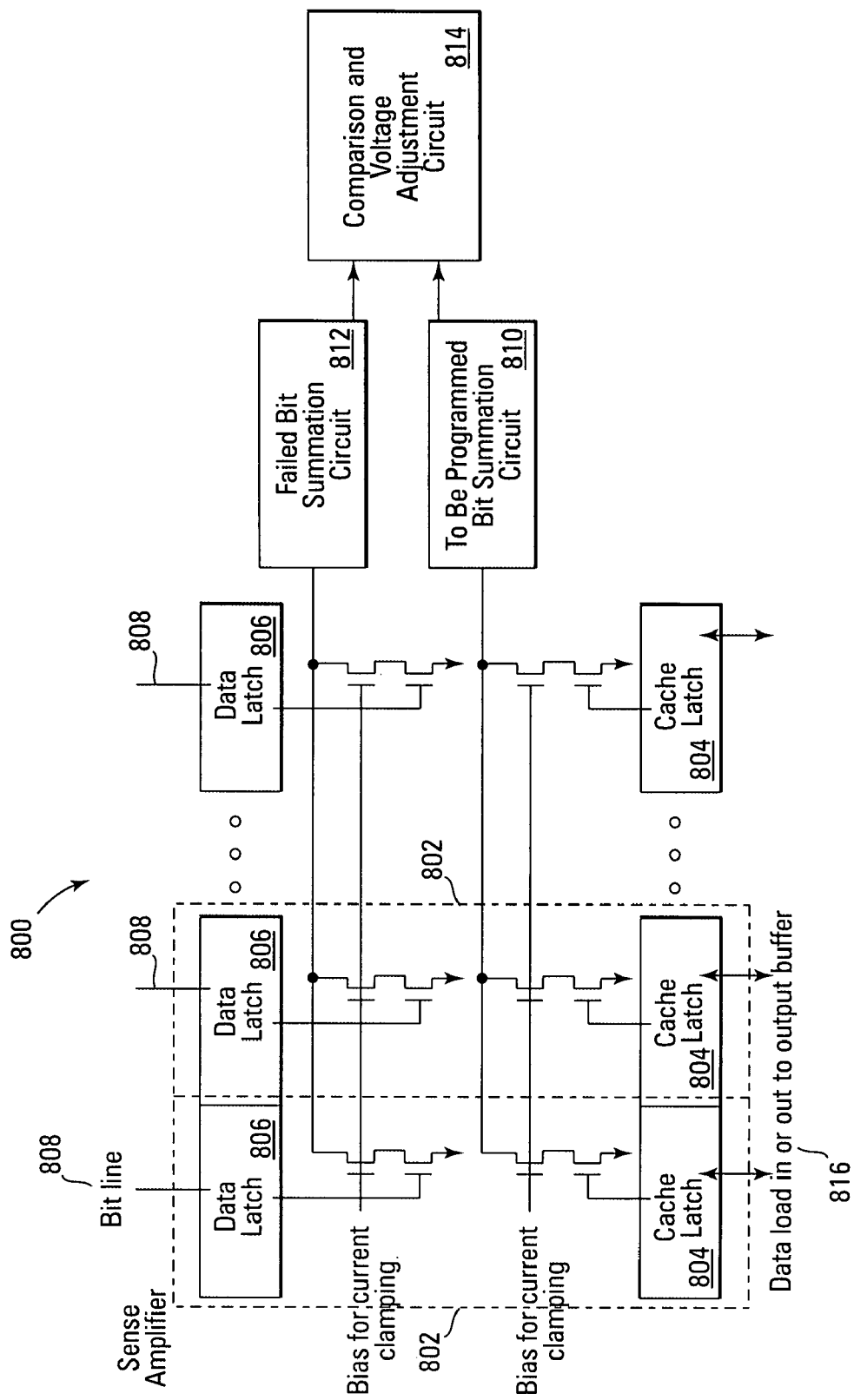
FIG. 8 is a simplified diagram of a sense amplifier circuit and control circuits in accordance with an embodiment of the present invention.

FIG. 8 details a simplified portion of the memory data cache and sense amplifier circuit 800 of an embodiment of the present invention. In FIG. 8, the data to be programmed is loaded from the I/O buffer (not shown) 816 to the data cache latches 804 of each sense amplifier 802 and is transferred to the data write latches 806 of the sense amplifiers 802 for programming. Each write data latch is coupled to a bit line 808 (optionally this coupling is through a column decoder (not shown)) and is used to program or inhibit the memory cell coupled through the bit line 808 of the non-volatile memory row selected by the row decoders (not shown) for programming. A bit summation circuit 810 is coupled to the data cache latches 804 to sum up the number of bits that are to be programmed in the program data loaded into the data cache latches 804. A failed verification bit summation circuit 812 is coupled to the write data latches 806 and is adapted to sum up the number of bits that have failed verification. The comparison and voltage adjustment circuit 814 then compares the number of bits to be programmed and the number of bits that have failed verification to calculate the percentage of bits that were programmed from the current program data held in the data cache latches 804 and sets the next gate programming voltage level by adjusting it in proportion to the relative percentage of bits that failed to program or by referring to a failed bit to increased gate programming voltage profile table.

It is noted that other programming voltage levels and sequences for NAND and NOR architecture non-volatile memory device programming method and array embodiments of the present invention are possible and should be apparent for those skilled in the art with the benefit of this disclosure.

CONCLUSION

A non-volatile memory device and programming process has been described that increases the programming voltage of successive programming cycles in relation to the percentage of the data bits that failed programming verification during the previous programming cycle and were not correctly programmed into the memory array. This allows for a faster on average program operation and a more accurate match of the subsequent increase in the programming voltage to the specific non-volatile memory device, the specific region or row being programmed, and any changes in programming characteristics due to device use and wear. In one embodiment of the present invention the manufacturing process/design and/or specific memory device is characterized by generating a failed bit percentage to programming voltage increase profile to set the desired programming voltage delta/increase for a given failing percentage of data bits. In another embodiment of the present invention, methods and apparatus are related for the programming of data into non-volatile memory devices and, in particular, NAND and NOR architecture Flash memory arrays and devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a non-volatile memory, comprising:
  calculating a number of data bits from data to be programmed into a non-volatile memory in a program operation;
  programming the data into the non-volatile memory;
  verifying the data programmed into the non-volatile memory and calculating a number of data bits that failed to program; and
  increasing a programming voltage in response to a comparison of the number of data bits in the data and the number of data bits from the data that failed to program.

2. The method of claim 1, wherein increasing a programming voltage in response to a comparison of the number of data bits in the data and the number of data bits from the data that failed to program further comprises increasing a programming voltage in response to the percentage of the data bits of the data that failed to correctly program.

3. The method of claim 1, further comprising:
  disabling programming of one or more memory cells that correctly programmed; and
  applying the increased programming voltage to program the data bits of the data that failed to program correctly.

4. The method of claim 1, further comprising:
  repeating for one or more iteration cycles,
    programming the data into the non-volatile memory;
    verifying the data programmed into the non-volatile memory and calculating a number of data bits that failed to program; and
    increasing a programming voltage in response to a comparison of the number of data bits in the data and the number of data bits from the data that failed to program.

5. The method of claim 1, further comprising:
  profiling the non-volatile memory to determine a profile of a programming voltage increase for a given percentage of the number of data bits from the data to be programmed and the number of data bits that failed to program.

6. The method of claim 5, wherein profiling the non-volatile memory to determine a profile of a programming voltage increase for a given percentage of the number of data bits from the data to be programmed and the number of data bits that failed to program further comprises profiling the non-volatile memory by one of profiling the non-volatile memory to determine a profile of a programming voltage increase for a given comparison of the number of data bits of the data to be programmed and the number of data bits that failed to program for the non-volatile memory manufacturing process or the non-volatile memory design, profiling the non-volatile memory device to determine a profile of a programming voltage increase for a given comparison of the number of data bits of the data to be programmed and the number of data bits that failed to program for a specific non-volatile memory or specific non-volatile memory region of a non-volatile memory.

7. The method of claim 1, wherein the non-volatile memory stores multiple bits in a single cell by one of multiple threshold levels and storing data trapped in a charge trapping layer near each of the sources/drains of one or more memory cell FETs.

8. The method of claim 1, wherein the non-volatile memory is one of a NAND architecture memory and a NOR architecture memory.

9. A method of operating a non-volatile memory, comprising:
  programming a plurality of data bits of data to be programmed into the non-volatile memory by applying a programming voltage to a plurality of memory cells;
  verifying the programmed data in the non-volatile memory; and
  increasing the programming voltage in a selected relation to the number of the plurality of data bits that failed to correctly program into the plurality of memory cells of the non-volatile memory.

10. The method of claim 9, further comprising:
  disabling programming of one or more memory cells that correctly programmed; and
  applying the increased programming voltage to program one or more bits of the data that failed to program correctly.

11. The method of claim 9, wherein increasing the programming voltage in a selected relation to the number of the plurality of data bits that failed to correctly program into the plurality of memory cells of the non-volatile memory further comprises increasing the programming voltage in a selected relation to the percentage of the plurality of data bits that failed to correctly program into the plurality of memory cells of the non-volatile memory.

12. The method of claim 9, further comprising:
  repeating for one or more iteration cycles,
    programming one or more of the plurality of data bits of data to be programmed into the non-volatile memory by applying the programming voltage to one or more of the plurality of memory cells;
    verifying the programmed data in the non-volatile memory; and
    increasing the programming voltage in a selected relation to the number of the plurality of data bits that failed to correctly program into the plurality of memory cells of the non-volatile memory.

13. The method of claim 12, wherein repeating for one or more iteration cycles further comprises iterating until a maximum number of iterations and/or a maximum programming voltage is reached.

14. The method of claim 9, further comprising:
  profiling the non-volatile memory to determine a profile of a programming voltage increase for a given percentage of the number of data bits that failed to correctly program into the plurality of memory cells of the non-volatile memory; and
  referring to the profile to determine the programming voltage increase for the number of the plurality of data bits that failed to correctly program into the plurality of memory cells of the non-volatile memory.

15. The method of claim 9, further comprising:
  keeping programming statistics on the non-volatile memory to determine a profile of a programming voltage increase for a given percentage of the number of data bits that failed to correctly program into the plurality of memory cells of the non-volatile memory; and
  referring to the profile to determine the programming voltage increase for the number of the plurality of data bits that failed to correctly program into the plurality of memory cells of the non-volatile memory.

16. A non-volatile memory device comprising:
  a non-volatile memory array;
  wherein the non-volatile memory device is adapted to program a plurality of data bits into the non-volatile memory array by,
    applying a programming voltage to a plurality of memory cells that are selected to be programmed with the plurality of data bits,
    verifying the plurality of data bits programmed into the plurality of memory cells of the non-volatile memory array, and
    increasing the programming voltage in a selected relation to the percentage of the plurality of data bits that failed to correctly program into the plurality of memory cells.

17. The non-volatile memory device of claim 16, wherein the non-volatile memory device is further adapted to program the plurality of data bits into the non-volatile memory array by,
  disabling programming of one or more memory cells that correctly programmed, and
  applying the increased programming voltage to program one or more bits of the data that failed to program correctly.

18. The non-volatile memory device of claim 16, wherein the non-volatile memory device is adapted to repeat programming the plurality of data bits into the non-volatile memory array for one or more iteration cycles, until none of the plurality of data bits fail to verify or a maximum number of iterations is reached.

19. The non-volatile memory device of claim 16, wherein the non-volatile memory device is adapted to increase the programming voltage in a selected relation to the percentage of the plurality of data bits that failed to correctly program into the plurality of memory cells by referring to a profile table to determine the programming voltage increase for the percentage of the plurality of data bits that failed to correctly program into the plurality of memory cells, where the profile table is specified by profiling the non-volatile memory device to determine the desired programming voltage delta increase for subsequent programming cycles for a given failing percentage of data bits that are being programmed into the non-volatile memory device.

20. The non-volatile memory device of claim 19, wherein the non-volatile memory device is adapted to increase the programming voltage in a selected relation to the percentage of the plurality of data bits that failed to correctly program into the plurality of memory cells by referring to memory cell programming statistics of the non-volatile memory array and the profile table to determine the programming voltage increase for the percentage of the plurality of data bits that failed to correctly program into the plurality of memory cells.

21. A system comprising:
  a host coupled to one or more non-volatile memory devices, wherein the system is adapted to program a plurality of data bits into a selected non-volatile memory device in a programming operation by,
    applying a programming voltage to a plurality of memory cells of the selected non-volatile memory device that are selected to be programmed with the plurality of data bits,
    verifying the plurality of data bits programmed into the plurality of memory cells of the selected non-volatile memory device, and
    increasing the programming voltage in a selected relation to the percentage of the plurality of data bits that failed to correctly program into the plurality of memory cells.

22. The system of claim 21, wherein the system is adapted to attempt to program any memory cells of the plurality of memory cells that failed to program correctly by, disabling programming of one or more memory cells that verified as correctly programmed, and applying the increased programming voltage in a programming operation to one or more bits of the data that failed to verify.

23. The system of claim 21, wherein the system is adapted to repeat the programming operation for one or more iteration cycles, until all of the plurality of data bits verify correctly or a maximum number of iterations is reached.

24. The system of claim 21, wherein the system is adapted to increase the programming voltage in a selected relation to the percentage of the plurality of data bits that failed to correctly program into the plurality of memory cells by referring to a profile table to determine the programming voltage increase for the percentage of the plurality of data bits that failed to correctly program into the plurality of memory cells.

25. The system of claim 21, wherein the non-volatile memory device is adapted to increase the programming voltage in a selected relation to the percentage of the plurality of data bits that failed to correctly program into the plurality of memory cells by referring to a memory cell wear level of the non-volatile memory device and a profile table to determine the programming voltage increase for the percentage of the plurality of data bits that failed to correctly program into the plurality of memory cells.

26. The system of claim 21, wherein the host is one of a processor and a memory controller.

* * * * *